US011211246B2

United States Patent
Komatsu et al.

(10) Patent No.: US 11,211,246 B2
(45) Date of Patent: Dec. 28, 2021

(54) METHOD AND COMPOSITION FOR SELECTIVELY MODIFYING BASE MATERIAL SURFACE

(71) Applicant: JSR CORPORATION, Tokyo (JP)

(72) Inventors: Hiroyuki Komatsu, Tokyo (JP); Tomohiro Oda, Tokyo (JP); Hitoshi Osaki, Tokyo (JP); Masafumi Hori, Tokyo (JP); Takehiko Naruoka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/288,385

(22) Filed: Feb. 28, 2019

(65) Prior Publication Data
US 2019/0198317 A1 Jun. 27, 2019

Related U.S. Application Data

(63) Continuation of application No. PCT/JP2017/030428, filed on Aug. 24, 2017.

(30) Foreign Application Priority Data

Sep. 1, 2016 (JP) .............................. JP2016-171341

(51) Int. Cl.
*H01L 21/027* (2006.01)
*B05D 3/02* (2006.01)
(Continued)

(52) U.S. Cl.
CPC .......... *H01L 21/0271* (2013.01); *B05D 1/327* (2013.01); *B05D 3/02* (2013.01);
(Continued)

(58) Field of Classification Search
None
See application file for complete search history.

(56) References Cited

U.S. PATENT DOCUMENTS

| 2002/0061980 A1* | 5/2002 | Hsu | C08F 8/42 525/332.8 |
| 2009/0318614 A1* | 12/2009 | Chevalier | C09C 1/3684 524/588 |
| 2010/0326699 A1* | 12/2010 | Greyling | H01B 3/006 174/137 B |

FOREIGN PATENT DOCUMENTS

| JP | 2003-76036 A | 3/2003 |
| JP | 2016-25355 A | 2/2016 |
| KR | 10-2012-0079094 A | 7/2012 |

OTHER PUBLICATIONS

International Search Report dated Nov. 21, 2017 in PCT/JP2017/030428 (with English translation), 6 pages.

(Continued)

*Primary Examiner* — Alexander G Ghyka
(74) *Attorney, Agent, or Firm* — Oblon, McClelland, Maier & Neustadt, L.L.P.

(57) ABSTRACT

A method for selectively modifying a base material surface, includes applying a composition on a surface of a base material to form a coating film. The coating film is heated. The base material includes a surface layer which includes a first region including silicon. The composition includes a first polymer and a solvent. The first polymer includes at an end of a main chain or a side chain thereof, a group including a first functional group capable of forming a bond with the silicon. The first region preferably contains a silicon oxide, a silicon nitride, or a silicon oxynitride. The base material preferably further includes a second region that is other than the first region and that contains a metal; and the method preferably further includes, after the heating, removing with a rinse agent a portion formed on the second region, of the coating film.

20 Claims, 1 Drawing Sheet

(51) Int. Cl.

| | | |
|---|---|---|
| B05D 7/14 | (2006.01) | |
| C09D 1/00 | (2006.01) | |
| H01L 21/321 | (2006.01) | |
| H01L 21/02 | (2006.01) | |
| B05D 3/14 | (2006.01) | |
| C09D 7/61 | (2018.01) | |
| C08F 112/08 | (2006.01) | |
| B05D 1/32 | (2006.01) | |
| B05D 3/10 | (2006.01) | |
| C08F 8/00 | (2006.01) | |
| H01L 21/768 | (2006.01) | |
| C09D 7/20 | (2018.01) | |
| C09D 5/00 | (2006.01) | |
| C09D 125/06 | (2006.01) | |
| C09D 125/16 | (2006.01) | |
| C09D 133/12 | (2006.01) | |
| C09D 183/04 | (2006.01) | |
| C23C 16/02 | (2006.01) | |
| H01L 21/311 | (2006.01) | |
| C08F 120/14 | (2006.01) | |
| B05D 1/00 | (2006.01) | |

(52) U.S. Cl.
CPC .............. *B05D 3/107* (2013.01); *B05D 3/148* (2013.01); *B05D 7/14* (2013.01); *C08F 8/00* (2013.01); *C08F 112/08* (2013.01); *C09D 1/00* (2013.01); *C09D 5/008* (2013.01); *C09D 7/20* (2018.01); *C09D 7/61* (2018.01); *C09D 125/06* (2013.01); *C09D 125/16* (2013.01); *C09D 133/12* (2013.01); *C09D 183/04* (2013.01); *C23C 16/0227* (2013.01); *H01L 21/02118* (2013.01); *H01L 21/02271* (2013.01); *H01L 21/02282* (2013.01); *H01L 21/02334* (2013.01); *H01L 21/02359* (2013.01); *H01L 21/31133* (2013.01); *H01L 21/321* (2013.01); *H01L 21/768* (2013.01); *B05D 1/005* (2013.01); *B05D 2518/10* (2013.01); *C08F 120/14* (2013.01); *C08F 2810/40* (2013.01)

(56) References Cited

OTHER PUBLICATIONS

Written Opinion of the International Searching Authority dated Nov. 21, 2017 in PCT/JP2017/030428 (with English translation), 7 pages.

Hashemi, F.S.M., et al. "Self-Correcting Process for High Quality Patterning by Atomic Layer Deposition", ACS NANO, vol. 9 No. 9, 2015, pp. 8710-8717.

Fang, M., et al., "Area-Selective Atomic Layer Deposition: Conformal Coating, Subnanometer Thickness Control, and Smart Positioning", ACS NANO, vol. 9, No. 9, 2015, pp. 8851-8854.

Lee, H., et al., "Mussel-Inspired Surface Chemistry for Multifunctional Coatings", NIH Public Access, Science, vol. 318, Oct. 19, 2007, pp. 1-10.

Hozumi, A., et al., "Preparation of a Well-Defined Amino-Terminated Self-Assembled Monolayer and Copper Microlines on a Polyimide Substrate Covered with an Oxide Nanoskin", Langmuir, vol. 21, No. 18, 2005, pp. 8234-8242.

Office Action dated Mar. 23, 2021 in Japanese Patent Application No. 2018-537212 (with English Translation).

Office Action dated Aug. 25, 2021 in Korean Patent Application No. 10-2019-7004869, 8 pages (with English Translation).

* cited by examiner

METHOD AND COMPOSITION FOR SELECTIVELY MODIFYING BASE MATERIAL SURFACE

CROSS-REFERENCE TO RELATED APPLICATIONS

The present application is a continuation application of International Application No. PCT/JP2017/030428, filed Aug. 24, 2017, which claims priority to Japanese Patent Application No. 2016-171341, filed Sep. 1, 2016. The contents of these applications are incorporated herein by reference in their entirety.

BACKGROUND OF THE INVENTION

Field of the Invention

The present invention relates to a method for selectivity modifying a base material surface, and to a composition.

Discussion of the Background

Further miniaturization of semiconductor devices has been accompanied by a demand for a technique of forming a fine pattern having a line width of less than 30 nm. However, it is technically difficult to meet such a demand by conventional methods employing lithography, due to optical factors and the like.

To this end, a bottom-up technique, as generally referred to, has been contemplated for forming a fine pattern. As the bottom-up technique, in addition to a method employing directed self-assembly of a polymer, a method for selectively modifying a base material having a surface layer that includes fine regions has been recently studied. The method for selectivity modifying the base material requires a material enabling easy and highly selective modification of surface regions, and various materials have been investigated for such use (see Japanese Unexamined Patent Application, Publication No. 2016-25355; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

The aforementioned conventional materials are low-molecular materials and therefore are unsuitable for application by spin coating in preexisting processes and requiring a Langmuir-Blodgett method.

SUMMARY OF THE INVENTION

According to an aspect of the present invention, a method for selectively modifying a base material surface, includes applying a composition on a surface of a base material to form a coating film. The coating film is heated. The base material includes a surface layer which includes a first region including silicon. The composition includes a first polymer and a solvent. The first polymer includes at an end of a main chain or a side chain thereof, a group including a first functional group capable of forming a bond with the silicon.

According to another aspect of the present invention, a composition for use in selective modification of a base material surface, includes a polymer and a solvent. The polymer includes at an end of a main chain or a side chain thereof, a group including a first functional group capable of forming a bond with silicon.

DESCRIPTION OF EMBODIMENTS

Figure 1:
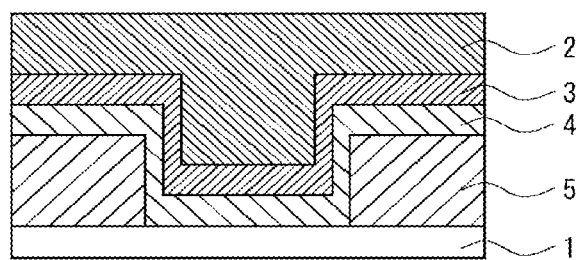
FIG. 1 is a cross sectional view illustrating a substrate for use in producing a striped substrate.

According to an embodiment of the invention made for solving the aforementioned problems, a method for selectively modifying a base material surface comprises: providing a base material including a surface layer which comprises a first region comprising silicon; applying a composition on a surface of the base material to form a coating film, the composition comprising: a first polymer comprising at an end of a main chain or a side chain, a group comprising a first functional group capable of forming a bond with the silicon; and a solvent; and heating the coating film.

According to another embodiment of the invention made for solving the aforementioned problems, a composition for use in selective modification of a base material surface comprises: a polymer comprising at an end of a main chain or a side chain, a group comprising a first functional group capable of forming a bond with silicon; and a solvent.

The method for selectively modifying a base material surface and the composition for use in selective modification of a base material surface of the embodiments of the present invention enable easy, highly selective and dense modification of surface regions containing silicon. Therefore, the method for selectively modifying a base material surface and the composition can be suitably used for working processes of semiconductor devices, and the like, in which microfabrication is expected to be further in progress hereafter.

Hereinafter, embodiments of the method for selectively modifying a base material surface (hereinafter, may be merely referred to as "selective modification method") will be described in detail.

Selective Modification Method

The selective modification method of the embodiment of the invention includes: providing a base material having a surface layer which includes a first region (hereinafter, may be also referred to as "region (I)") containing silicon (hereinafter, may be also referred to as "providing step"); a step of applying a composition (hereinafter, may be also referred to as "composition (I)") on a surface of the base material to form a coating film, the composition containing: a first polymer (hereinafter, may be also referred to as "(A) polymer" or "polymer (A)") having at an end of a main chain or a side chain, a group (hereinafter, may be also referred to as "group (I)") containing a first functional group (hereinafter, may be also referred to as "functional group (A)") capable of forming a bond with the silicon; and a solvent (hereinafter, may be also referred to as "(B) solvent" or "solvent (B)") (hereinafter, may be also referred to as "applying step"); and a step of heating the coating film (hereinafter, may be also referred to as "heating step"). In the selective modification method, it is preferred that: the base material further has a second region (hereinafter, may be also referred to as "region (II)") that is other than the region (I) and that contains a metal; and the method further includes, after the heating step, a step of removing with a rinse agent a portion of the coating film, the portion being formed on the region (II) (hereinafter, may be also referred to as "removing step").

The selective modification method may further include, for example:

a step of bringing an alcohol, a dilute acid, ozone or plasma into contact with the surface of the base material after the removing step (hereinafter, may be also referred to as "contacting step"); a step of depositing a pattern on the surface of the base material after the removing step, with a CVD method or an ALD method (hereinafter, may be also referred to as "depositing step"); a step of etching away the polymer (A) from the surface of the base material after the removing step (hereinafter, may be also referred to as "etching step"); and the like. Hereinafter, each step is explained.

Providing Step

In this step, the base material having a surface layer that includes the region (I) containing silicon is provided. The region (I) is not particularly limited as long as the region contains a silicon element.

The silicon may be contained in the region (I) in the form of a silicon simple substance, a silicon oxide, a silicon nitride, a silicon oxynitride, or the like.

The silicon oxide is exemplified by $SiO_2$ and the like.

The silicon nitride is exemplified by SiNx, $Si_3N_4$ and the like.

The silicon oxynitride is exemplified by SiON and the like.

The base material typically has a surface layer which includes a region (II) that is other than the region (I) and that contains a metal.

The metal is not particularly limited as long as it is a metal element, and examples of the metal include copper, iron, zinc, cobalt, aluminum, titanium, tin, tungsten, zirconium, titanium, tantalum, germanium, molybdenum, ruthenium, gold, silver, platinum, palladium, nickel, and the like. Of these, copper, cobalt, tungsten, and tantalum are preferred.

The form of the metal contained in the region (II) is exemplified by a metal simple substance, an alloy, a conductive nitride, a metal oxide, a silicide, and the like.

Examples of the metal simple substance include simple substances of metals such as copper, iron, cobalt, tungsten and tantalum, and the like.

Examples of the alloy include a nickel-copper alloy, a cobalt-nickel alloy, a gold-silver alloy, and the like.

Examples of the conductive nitride include titanium nitride, titanium nitride, iron nitride, aluminum nitride and the like.

Examples of the metal oxide include tantalum oxide, aluminum oxide, iron oxide, copper oxide and the like.

Examples of the silicide include iron silicide, molybdenum silicide, and the like. Of these, the metal simple substance, the alloy, the conductive nitride and the silicide are preferred; the metal simple substance and the conductive nitride are more preferred; and a copper simple substance, a cobalt simple substance, a tungsten simple substance, a tantalum simple substance and tantalum nitride are still more preferred.

A mode of the arrangement of the region (I) and/or the region (II) on the surface layer of the base material is not particularly limited, and is exemplified by surficial, spotted, striped, and the like in a planar view. The size of the region (I) and the region (II) is not particularly limited, and may be an appropriately desired size.

The shape of the base material is not particularly limited, and may be an appropriately desired shape such as platy (substrate), spherical, and the like.

Applying Step

In this step, the composition (I) is applied on the surface of the base material.

The applying procedure of the composition (I) is exemplified by spin coating and the like.

Composition (I)

The composition (I) contains the polymer (A) and the solvent (B). The composition (I) may also contain other component(s) in addition to the polymer (A) and the solvent (B).

(A) Polymer

The polymer (A) has the group (I) at an end of a main chain or a side chain. The "main chain" as referred to means the longest one of the atom chains of a polymer. The "side chain" as referred to means an atom chain of a polymer other than the main chain. Of these, in light of further increasing the density of the polymer (A) that modifies the surface, the polymer (A) has the group (I) preferably at an end of the main chain, and more preferably at one end of the main chain.

The group (I) contains the functional group (A) capable of forming a bond with the silicon. The functional group (A) forms a bond with the silicon. The bond is, for example, a chemical bond, a covalent bond, an ionic bond, a coordinate bond or the like. Of these, from the perspective that a stronger bond between the silicon and the functional group is formed, the covalent bond is preferred.

The functional group (A) is exemplified by a functional group that forms a covalent bond or the like with the silicon, and the like, and examples of the functional group (A) include —$SiR_x(OR')_{3-x}$, —$SiR_y(OR')_{2-y}$— and the like. R and R' each independently represent a hydrogen atom or a monovalent hydrocarbon group having 1 to 20 carbon atoms. x is an integer of 0 to 3. y is an integer of 0 to 2. It is to be noted that, in a case in which R is present in a plurality of number, the plurality of Rs may be identical or different, and in a case in which R' is present in a plurality of number, the plurality of R's may be identical or different.

The monovalent hydrocarbon group having 1 to 20 carbon atoms which may be represented by R and R' is exemplified by a monovalent chain hydrocarbon group having 1 to 20 carbon atoms, monovalent alicyclic hydrocarbon group having 3 to 20 carbon atoms, monovalent aromatic hydrocarbon group having 6 to 20 carbon atoms, and the like.

R represents preferably a hydrogen atom, a chain hydrocarbon group or an aromatic hydrocarbon group, more preferably a hydrogen atom, an alkyl group or an aryl group, and still more preferably a hydrogen atom or a methyl group.

R' represents preferably a hydrogen atom or an alkyl group, and more preferably a hydrogen atom or a methyl group.

Preferably, x is 0, 1 or 3. Preferably, y is 0 or 2.

The functional group (A) is preferably a group containing a silicon atom to which OH bonds or a group containing a silicon atom to which trialkoxysilyl and H bond, and more preferably a hydroxydimethylsilyl group, a trimethoxysilylmethyl group or a dimethylsilyl group.

The polymer (A) is exemplified by a styrene polymer, a (meth)acrylic polymer, an ethylene polymer, a siloxane-based polymer, a copolymer composed of a combination thereof (e.g., a random copolymer, a gradient (composition gradient) copolymer, a graft copolymer and a block copolymer), and the like.

The styrene polymer has a structural unit derived from a substituted or unsubstituted styrene.

Examples of the substituted styrene include α-methylstyrene, o-, m- or p-methylstyrene, p-t-butylstyrene, 2,4,6- trimethylstyrene, p-methoxystyrene, p-t-butoxystyrene, o-, m- or p-vinylstyrene, o-, m- or p-hydroxystyrene, m- or p-chloromethylstyrene, p-chlorostyrene, p-bromostyrene, p-iodostyrene, p-nitrostyrene, p-cyanostyrene, and the like.

The (meth)acrylic polymer has a structural unit derived from (meth)acrylic acid or a (meth)acrylic acid ester.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate, 3-trimethylsilylpropyl (meth)acrylate, N,N-dimethylaminoethyl (meth)acrylate and N,N-diethylaminoethyl (meth)acrylate; and the like.

The ethylene polymer has a structural unit derived from a substituted or unsubstituted ethylene.

Examples of the substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene, vinyl glycidyl ether, vinyl trimethylsilyl ether, and the like.

The siloxane-based polymer has a structural unit containing a —Si—O— bond.

The structural unit containing a —Si—O— bond is exemplified by:

alkyl hydrogen siloxane units such as a methyl hydrogen siloxane unit;

dialkylsiloxane units such as a dimethylsiloxane unit;

alkylalkoxysiloxane units such as a methylmethoxysiloxane unit;

dialkoxysiloxane units such as a dirnethoxysiloxane unit; and the like.

The polymer (A) is preferably the styrene polymer and the (meth)acrylic polymer, or the siloxane-based polymer, more preferably the styrene polymer, and still more preferably polystyrene or poly-t-butyl styrene.

The lower limit of the number average molecular weight (Mn) of the polymer (A) is preferably 500, more preferably 2,000, still more preferably 4,000, and particularly preferably 5,000. The upper limit of the Mn is preferably 50,000, more preferably 30,000, still more preferably 15,000, and particularly preferably 8,000.

The upper limit of the ratio (Mw/Mn, dispersity index) of the weight average molecular weight (Mw) to the Mn of the polymer (A) is preferably 5, more preferably 2, still more preferably 1.5, and particularly preferably 1.3. The lower limit of the Mw/Mn ratio is typically 1, and preferably 1.05.

The lower limit of the content of the polymer (A) in the composition (I) with respect to the total solid content is preferably 80% by mass, more preferably 90% by mass, and still more preferably 95% by mass. The upper limit of the content is, for example, 100% by mass. The "total solid content" as referred to means the sum of the components other than the solvent (B).

(B) Solvent

The solvent (B) is not particularly limited as long as it is a solvent capable of dissolving or dispersing at least the polymer (A) and other component(s).

The solvent (B) is exemplified by an alcohol solvent, an ether solvent, a ketone solvent, an amide solvent, an ester solvent, a hydrocarbon solvent, and the like.

Examples of the Alcohol Solvent Include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether; and the like.

Examples of the Ether Solvent Include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methyl phenyl ether); and the like.

Examples of the Ketone Solvent Include:

chain ketone solvents such as acetone, methyl ethyl ketone, methyl-n-propyl ketone, methyl n-butyl ketone, diethyl ketone, methyl iso-butyl ketone, 2-heptanone (methyl n-pentylketone), ethyl n-butyl ketone, methyl-n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the Amide Solvent Include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the Ester Solvent Include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvent is preferred, the polyhydric alcohol partially etherated carboxylate solvent is more preferred, and propylene glycol monomethyl ether acetate is still more preferred. The composition (I) may contain one type of the solvent (B), or two or more types thereof.

Other Component

The composition (I) may also contain other component(s) in addition to the polymer (A) and the solvent (B). The other component(s) is/are exemplified by a surfactant and the like. When the composition (I) contains the surfactant, the coating characteristics onto the base material surface may be improved.

Preparation Method of Composition (I)

The composition (I) may be prepared by, for example, mixing the polymer (A), the solvent (B), and as needed the other component(s) at a predetermined ratio, and preferably filtering the resulting mixture through a high-density polyethylene filter with fine pores of about 0.45 μm, etc. The lower limit of the solid content concentration of the composition (I) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Heating Step

In this step, the coating film formed by the applying step is heated. Accordingly, formation of the bond between the metal (A) on the substrate, layer of the base material and the functional group (A) in the polymer (A) of the composition (I) is accelerated, whereby a coating film (hereinafter, may be also referred to as "coating film (I)") containing the polymer (A) is overlaid on the region (I) of the base material surface.

Means for heating may be, for example, an oven, a hot plate, and the like. The lower limit of the temperature for the heating is preferably 80° C., more preferably 100° C., and still more preferably 130° C. The upper limit of the temperature for the heating is preferably 400° C., more preferably 300° C., and still more preferably 200° C. The lower limit of the time period of the heating is preferably 10 sec, more preferably 1 min, and still more preferably 2 min. The upper limit of the time period of the heating is preferably 120 min, more preferably 10 min, and still more preferably 5 min.

The average thickness of the coating film (I) formed can be adjusted to a desired value through appropriately selecting the type and concentration of the polymer (A) in the composition (I), and conditions in the heating step such as the heating temperature and the heating time period. The lower limit of the average thickness of the coating film (I) is preferably 0.1 nm, more preferably 1 nm, and still more preferably 3 nm. The upper limit of the average thickness is, for example, 20 nm.

Removing Step

In this step, a portion formed on the region (II), of the coating film (I) is removed. Accordingly, a portion containing the polymer (A) not bonded to the silicon after the heating step is removed, whereby a base material having the region (I) being selectively modified is obtained.

The removing in the removing step is carried out typically by rinsing the base material after the heating step with a rinse agent. The rinse agent used is typically an organic solvent, and for example, a polyhydric alcohol partially etherated carboxylate solvent such as propylene glycol monomethyl ether acetate, a monohydric alcohol solvent such as isopropanol, or the like may be used.

The aforementioned process enables easy, highly selective and dense modification of surface regions containing a metal. The base material thus obtained may be processed in various ways by carrying out the following steps, for example.

Contacting Step

In this step, an alcohol, a dilute acid, a hydrogen peroxide solution, ozone or plasma is brought into contact with the surface of the base material after the removing step. Accordingly, an air-oxidized film layer formed on the region (II) is enabled to be removed. The dilute acid is not particularly limited, and examples of the dilute acid include dilute hydrochloric acid, dilute sulfuric acid, dilute nitric acid, dilute citric acid, dilute oxalic acid, dilute maleic acid, dilute acetic acid, dilute isobutyric acid, dilute 2-ethylhexanoic acid, and the like.

Depositing Step

In this step, a pattern is deposited on the surface of the base material after the removing step, with a CVD (chemical vapor deposition) method or an ALD (atomic layer deposition) method. Accordingly, a pattern may be selectively formed on the region (II) not covered with the polymer (A).

Etching Step

In this step, the polymer (A) on the surface of the base material after the removing step is etched away.

The etching procedure is exemplified by well-known techniques including: reactive ion etching (RIE) such as chemical dry etching carried out using $CF_4$, an $O_2$ gas or the like by utilizing the difference in etching rate of each layer, etc., as well as chemical wet etching (wet development) carried out by using an etching liquid such as an organic solvent or hydrofluoric acid; physical etching such as sputtering etching and ion beam etching. Of these, the reactive ion etching is preferred, and the chemical dry etching and the chemical wet etching are more preferred.

Prior to the chemical dry etching, an irradiation with a radioactive ray may be also carried out as needed. As the radioactive ray, when the portion to be etched away is a polymer including a methyl polymethacrylate block, a UV irradiation or the like may be used. An oxygen plasma treatment may also be used. The UV irradiation or the oxygen plasma treatment results in degradation of the methyl polymethacrylate block, whereby the etching is facilitated.

Examples of the organic solvent for use in the chemical wet etching include:

alkanes such as n-pentane, n-hexane and n-heptane;

cycloalkanes such as cyclohexane, cycloheptane and cyclooctane;

saturated carboxylic acid esters such as ethyl acetate, n-butyl acetate, i-butyl acetate and methyl propionate;

ketones such as acetone, methyl ethyl ketone, methyl isobutyl ketone and methyl n-pentyl ketone;

alcohols such as methanol, ethanol, 1-propanol, 2-propanol and 4-methyl-2-pentanol; and the like. These solvents may be used either alone, or two or more types thereof may be used in combination.

EXAMPLES

Hereinafter, the present invention is explained in detail by way of Examples, but the present invention is not limited to these Examples. Measuring methods for physical properties are shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 μL;
column temperature: 40° C.;
detector: differential refractometer; and
standard substance: mono-dispersed polystyrene.

$^{13}$C-NMR Analysis $^{13}$C-NMR analysis was carried out using a nuclear magnetic resonance apparatus ("JNM-EX400" available from JEOL, Ltd.), with CDCl$_3$ for use as a solvent for measurement. The proportion of each structural unit in the polymer was calculated from an area ratio of a peak corresponding to each structural unit on the spectrum obtained by the $^{13}$C-NMR.

Synthesis of Polymer (A)

Synthesis Example 1

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 1 mL of methanol as a chain-end terminator was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.7 g of a white polymer (A-1). The polymer (A-1) had the Mw of 5,600, the Mn of 5,300, and the Mw/Mn of 1.06.

Synthesis Example 2

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.32 mL of 4-chloromethyl-2,2-dimethyl-1,3-dioxolane (2.30 mmol) as a chain-end terminator was charged to conduct a terminating reaction of the polymerization end. Subsequently, 10 g of a 1 N aqueous hydrochloric acid solution was added thereto, and the mixture thus obtained was stirred under heating at 60° C. for 2 hrs and then subjected to a hydrolysis reaction, to give a polymer having a diol structure as a terminal group. The reaction solution was cooled to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.3 g of a white polymer (A-2). The polymer (A-2) had the Mw of 5,300, the Mn of 4,900, and the Mw/Mn of 1.08.

Synthesis Example 3

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min and carbon dioxide was blown thereinto. Next, 1.0 g of methanol was charged to conduct a terminating reaction of the polymerization end. The reaction solution was cooled to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.6 g of a white polymer (A-3). The polymer (A-3) had the Mw of 5,300, the Mn of 4,900, and the Mw/Mn of 1.08.

Synthesis Example 4

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.47 mL of a 1 N cyclohexane solution of sec-butyllithium (sec-BuLi) (2.40 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min and 1.0 g of dimethylsiloxane (4.50 mmol) was added thereto. Next, 1 mL of methanol was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of ultra pure water was charged and the mixture was stirred, followed by removing the aqueous underlayer. This operation was repeated five times, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-4). This polymer (A-4) had the Mw of 6,200, the Mn of 6,000, and the Mw/Mn of 1.04.

Synthesis Example 5

After a 500 mL flask as a reaction vessel was dried under reduced pressure, 120 g of THF which had been subjected to a distillation dehydrating treatment in a nitrogen atmosphere was charged, and cooled to 0° C. Thereafter, 2.47 mL of a 1 N cyclohexane solution of sec-butyllithium (sec-BuLi) (2.40 mmol) was charged into this THF, and then 27.6 g of 1,3,5,7-tetramethylcyclotetrasiloxane (0.115 mol) was added thereto. The mixture was matured for 120 min under ice-cooling. Next, 1 mL of methanol was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of ultra pure water was charged and the mixture was stirred, followed by removing the aqueous underlayer. This operation was repeated five times, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 26.9 g of a white polymer (A-5). The polymer (A-5) had the Mw of 7,600, the Mn of 6,600, and the Mw/Mn of 1.15.

Synthesis Example 6

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.37 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.35 mL of chloromethyltrimethoxysilane (2.30 mmol) as a chain-end terminator was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of ultra pure water was charged and the mixture was stirred, followed by removing the aqueous underlayer. This operation was repeated five times to remove Li salt, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.8 g of a white polymer (A-6). This polymer (A-6) had the Mw of 6,000, the Mn of 5,800, and the Mw/Mn of 1.04.

Synthesis Example 7

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.37 mL of a 1 N cyclohexane solution of sec-butyllithium (sec-BuLi) (2.30 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.25 mL of chlorodimethylsilane (2.30 mmol) was added to conduct a terminating reaction of the polymerization end. The temperature of the reaction solution was elevated to the room temperature, and the reaction solution was concentrated. Thereafter, the solvent was substituted with MIBK. Thereafter, 1,000 g of ultra pure water was charged and the mixture was stirred, followed by removing the aqueous underlayer. This operation was repeated five times, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-7). This polymer (A-7) had the Mw of 5,200, the Mn of 5,000, and the Mw/Mn of 1.04.

Synthesis Example 8

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.57 mL of a 1 N cyclohexane solution of sec-butyllithium (sec-BuLi) (2.50 mmol) was charged into this tetrahydrofuran, and then 13.7 mL of tert-butylstyrene (0.0748 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Subsequently, 0.38 mL of chloromethyltrimethoxysilane (2.50 mmol) as a chain-end terminator was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of ultra pure water was charged and the mixture was stirred, followed by removing the aqueous underlayer. This operation was repeated five times to remove Li salt, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.8 g of a white polymer (A-8). The polymer (A-8) had the Mw of 4,800, the Mn of 4,500, and the Mw/Mn of 1.07.

Synthesis Example 9

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 2.40 mL of a 1 N toluene solution of ethylene oxide (2.40 mmol) was added thereto and then 1 mL of methanol was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-9). This polymer (A-9) had the Mw of 5,200, the Mn of 5,000, and the Mw/Mn of 1.04.

Synthesis Example 10

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min and 1.0 g of dimethylsiloxane (4.50 mmol) was added thereto. Next, 1 mL of methanol was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.2 g of a white polymer (A-10). This polymer (A-10) had the Mw of 6,200, the Mn of 6,000, and the Mw/Mn of 1.04.

Synthesis Example 11

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.36 mL of chloromethyltrimethoxysilane (2.40 mmol) was added to conduct a terminating reaction of the polymerization end. The temperature of the reaction solution was elevated to the room temperature, and the reaction solution was concentrated. Thereafter, the solvent was substituted with MIBK. Thereafter, 1,000 g of ultra pure water was charged and the mixture was stirred, followed by removing the aqueous underlayer. This operation was repeated five times, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-11). This polymer (A-11) had the Mw of 5,200, the Mn of 5,000, and the Mw/Mn of 1.04.

Synthesis Example 12

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.27 mL of chlorodimethylsilane (2.40 mmol) was added to conduct a terminating reaction of the polymerization end. The temperature of the reaction solution was elevated to the room temperature, and the reaction solution was concentrated. Thereafter, the solvent was substituted with MIBK. Thereafter, 1,000 g of ultra pure water was charged and the mixture was stirred, followed by removing the aqueous underlayer. This operation was repeated five times, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-12). This polymer (A-12) had the Mw of 5,200, the Mn of 5,000, and the Mw/Mn of 1.04.

Synthesis Example 13

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Subsequently, 0.39 mL of pentamethylchlorodisilane (2.01 mmol) as a chain-end terminator was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.7 g of a white polymer (A-13). The polymer (A-13) had the Mw of 5,600, the Mn of 5,300, and the Mw/Mn of 1.06.

Synthesis Example 14

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 1 mL of 4-trimethylsilylstyrene (5.6 mmol) was added to carry out block copolymerization, and then 1 mL of methanol as a chain-end terminator was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.8 g of a white polymer (A-14). The polymer (A-14) had the Mw of 5,500, the Mn of 5,300, and the Mw/Mn of 1.04.

Synthesis Example 15

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Then, 0.98 mL of 1,1-diphenylethylene (6.91 mmol) was added thereto and the color of the mixture was ascertained to be dark brown. Next, 1.0 mL of N,N-dimethylaminoethyl methacrylate (6.04 mmol) was added and block copolymerization was carried out for 1 hour, and then 1 mL of methanol as a chain-end terminator was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.9 g of a white polymer (A-15). The polymer (A-15) had the Mw of 5,600, the Mn of 5,300, and the Mw/Mn of 1.06.

Synthesis Example 16

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Subsequently, 0.35 mL of N,N-dimethylaminosilylchloride (2.31 mmol) as a chain-end terminator was charged to conduct a terminating reaction of the polymerization end. The temperature of the reaction solution was elevated to the room temperature and the reaction solution was added dropwise into 500 g of methanol to allow the polymer to be precipitated. The operation was repeated three times and the solid was collected on a Buechner funnel. Thus obtained solid was dried under reduced pressure at 60° C. to give 11.7 g of a white polymer (A-16). The polymer (A-16) had the Mw of 5,600, the Mn of 5,100, and the Mw/Mn of 1.10.

Preparation of Composition

Preparation Example 1

A composition (S-1) was prepared by: adding 98.8 g of propylene glycol monomethyl acetate (PGMEA) as the solvent (B) to 1.2 g of (A-1) as the polymer (A); stirring the mixture; and then filtering the stirred mixture through a high-density polyethylene filter with fine pores having a pore size of 0.45 μm.

Preparation Examples 2 to 16

Compositions (S-2) to (S-16) were prepared by a similar operation to that of Preparation Example 1 except that the type and the content of each component used were as shown in Table 1.

TABLE 1

| Amount Blended (mass (g)) | | | Preparation Examples | | | | | | | |
|---|---|---|---|---|---|---|---|---|---|---|
| | | | 1 | 2 | 3 | 4 | 5 | 6 | 7 | 8 |
| | | Composition | S-1 | S-2 | S-3 | S-4 | S-5 | S-6 | S-7 | S-8 |
| Polymer (A) | A-1 | PS-ω-H | 1.2 | | | | | | | |
| | A-2 | PS-ω-DOH | | 1.2 | | | | | | |
| | A-3 | PS-ω-COOH | | | 1.2 | | | | | |
| | A-4 | PS-b-DMS-ω-SiOH | | | | 1.2 | | | | |
| | A-5 | PDMS-ω-SiOH | | | | | 1.2 | | | |
| | A-6 | PS-ω-Si(OMe)$_3$ | | | | | | 1.2 | | |
| | A-7 | PS-ω-SiH | | | | | | | 1.2 | |
| | A-8 | tBuSt-ω-Si(OMe)$_3$ | | | | | | | | 1.2 |
| | A-9 | PMMA-ω-OHp | | | | | | | | |
| | A-10 | PMMA-b-DMS-ω-SiOH | | | | | | | | |
| | A-11 | PMMA-ω-Si(OMe)$_3$ | | | | | | | | |
| | A-12 | PMMA-ω-SiH | | | | | | | | |
| | A-13 | PS-Si$_2$Me$_5$ | | | | | | | | |
| | A-14 | PS-b-PSTMS | | | | | | | | |
| | A-15 | PS-b-DMAEMA | | | | | | | | |
| | A-16 | PS-ω-SiNMe$_2$ | | | | | | | | |
| Solvent (B) | B-1 | PGMEA | 98.8 | 98.8 | 98.8 | 98.8 | 98.8 | 98.8 | 98.8 | 98.8 |

| Amount Blended (mass (g)) | | | Preparation Examples | | | | | | | |
|---|---|---|---|---|---|---|---|---|---|---|
| | | | 9 | 10 | 11 | 12 | 13 | 14 | 15 | 16 |
| | | Composition | S-9 | S-10 | S-11 | S-12 | S-13 | S-14 | S-15 | S-16 |
| Polymer (A) | A-1 | PS-ω-H | | | | | | | | |
| | A-2 | PS-ω-DOH | | | | | | | | |
| | A-3 | PS-ω-COOH | | | | | | | | |
| | A-4 | PS-b-DMS-ω-SiOH | | | | | | | | |
| | A-5 | PDMS-ω-SiOH | | | | | | | | |
| | A-6 | PS-ω-Si(OMe)$_3$ | | | | | | | | |

TABLE 1-continued

|   | | Col1 | Col2 | Col3 | Col4 | Col5 | Col6 | Col7 | Col8 |
|---|---|---|---|---|---|---|---|---|---|
| | A-7 | PS-ω-SiH | | | | | | | | |
| | A-8 | tBuSt-ω-Si(OMe)$_3$ | | | | | | | | |
| | A-9 | PMMA-ω-OHp | 1.2 | | | | | | | |
| | A-10 | PMMA-b-DMS-ω-SiOH | | 1.2 | | | | | | |
| | A-11 | PMMA-ω-Si(OMe)$_3$ | | | 1.2 | | | | | |
| | A-12 | PMMA-ω-SiH | | | | 1.2 | | | | |
| | A-13 | PS-Si$_2$Me$_5$ | | | | | 1.2 | | | |
| | A-14 | PS-b-PSTMS | | | | | | 1.2 | | |
| | A-15 | PS-b-DMAEMA | | | | | | | 1.2 | |
| | A-16 | PS-ω-SiNMe$_2$ | | | | | | | | 1.2 |
| Solvent (B) | B-1 | PGMEA | 98.8 | 98.8 | 98.8 | 98.8 | 98.8 | 98.8 | 98.8 | 98.8 |

Evaluations

Each of the compositions prepared as described above was evaluated according to the following method.

Examples 1 to 17 and 21 to 25, Comparative Examples 1 and 2, and Reference Examples 1 to 6

The silicon oxide substrate was subjected to a surface treatment with isopropanol. After eight-inch substrates (copper substrate, cobalt substrate, tungsten substrate, tantalum substrate, tantalum nitride film substrate) were immersed n a 5% by mass aqueous oxalic acid solution, they were dried by a nitrogen flow to remove oxidized coating films on the surfaces.

Next, the compositions prepared as described above were spin-coated by using Track ("TELDSA ACT8" available from Tokyo Electron Limited) at 1,500 rpm, and baked at 150° C. for 180 sec. The substrate was subjected to a separation with PGMEA to remove unreacted polymer. The selective surface modification material formed on the substrate had a thickness of about 0 nm to 5 nm as a result of the measurement of the film thickness with an ellipsometer. Next, the surface contact angle (SCA) value was measured by using a contact angle meter ("Drop master DM-501" available from Kyowa Interface Science Co., LTD.). Furthermore, arrangement density σ (chains/nm$^2$) of the polymer (A) (brush) was calculated on the basis of the film thickness according to the following formula (1):

$$\sigma = d \times L \times NA \times 10^{-21}/Mn \quad (1)$$

d: density (g/cm$^3$) of polymer (A); L: average thickness (nm) of the film; NA: Avogadro's number; and Mn: number average molecular weight of polymer (A).

With respect to each metal substrate and each silicon oxide substrate, the average thickness (nm), the contact angle (°), polymer (brush) density (chains/nm$^2$), and the composition coating property of the polymer film formed on the surface of the substrate are shown in Table 2, respectively. In Table 2, "-" denotes that the selectivity on the base material surface was not indicated and therefore the arrangement density of the polymer was not calculated.

The composition coating property was visually observed and evaluated according to the following criteria.

A: Coating property being favorable
B: Slight repellency being observed
C: Coating being difficult

TABLE 2

| Composition | Sample | | Thickness (nm) | | SCA (°) | | Brush density (chains/nm$^2$) | Coating property |
|---|---|---|---|---|---|---|---|---|
| Copper substrate | | | Copper | Si oxide | Copper | Si oxide | | |
| (Control) | | | | | 10 | 36 | — | |
| Comparative Example 1 | S-1 | PS-ω-H | 0.6 | 0.7 | 43 | 45 | — | A |
| Reference Example 1 | S-2 | PS-ω-DOH | 3.7 | 3.6 | 89 | 88 | — | A |
| Example 1 | S-5 | PDMS-ω-SiOH | 1.1 | 4.5 | 34 | 76 | 0.43 | B |
| Example 2 | S-4 | | 1.0 | 4.6 | 33 | 89 | 0.48 | B |
| Example 3 | S-6 | PS-ω-Si(OMe)$_3$ | 0.6 | 5.2 | 32 | 88 | 0.56 | A |
| Example 4 | S-7 | PS-ω-SiH | 0.5 | 2.6 | 33 | 87 | 0.32 | A |
| Example 5 | S-8 | tBuSt-ω-Si(OMe)$_3$ | 0.8 | 5.1 | 37 | 101 | 0.70 | A |
| Example 21 | S-13 | PS-ω-Si$_2$Me$_5$ | 0.7 | 4.6 | 40 | 90 | 0.55 | A |
| Example 22 | S-14 | PS-b-PSTMS | 0.6 | 4.5 | 41 | 90 | 0.54 | A |
| Example 23 | S-15 | PS-b-DMAEMA | 0.4 | 4.8 | 38 | 89 | 0.56 | A |
| Example 24 | S-16 | PS-ω-SiNMe$_2$ | 0.4 | 4.7 | 44 | 89 | 0.57 | A |
| Cobalt substrate | | | Cobalt | Si oxide | Cobalt | Si oxide | | |
| (Control) | | | | | 10 | 36 | — | |
| Comparative Example 2 | S-1 | PS-ω-H | 0.6 | 0.7 | 42 | 45 | — | A |
| Reference Example 2 | S-3 | PS-ω-COOH | 3.7 | 3.6 | 89 | 88 | — | A |
| Example 6 | S-5 | PDMS-ω-SiOH | 0.6 | 4.9 | 34 | 76 | 0.47 | B |
| Example 7 | S-6 | PS-ω-Si(OMe)$_3$ | 0.5 | 5.2 | 31 | 89 | 0.56 | A |
| Example 8 | S-8 | tBuSt-ω-Si(OMe)$_3$ | 0.6 | 5.1 | 35 | 102 | 0.70 | A |

TABLE 2-continued

| Composition | Sample | Thickness (nm) | | SCA (°) | | Brush density (chains/nm²) | Coating property |
|---|---|---|---|---|---|---|---|
| Tungsten substrate | | W | Si oxide | W | Si oxide | | |
| Reference Example 3 (Control) | S-3 PS-ω-COOH | 3.7 | 3.6 | 10 89 | 36 88 | — | — A |
| Example 9 | S-5 PDMS-ω-SiOH | 0.6 | 4.9 | 34 | 77 | 0.47 | B |
| Example 10 | S-6 PS-ω-Si(OMe)₃ | 0.6 | 5.2 | 32 | 89 | 0.56 | A |
| Example 25 | S-15 PS-b-DMAEMA | 0.3 | 5.1 | 37 | 89 | 0.60 | A |
| Tantalum substrate | | Tantalum | Si oxide | Tantalum | Si oxide | | |
| Reference Example 4 (Control) | S-2 PS-ω-DOH | 3.5 | 3.6 | 50 89 | 46 88 | — | — A |
| Example 11 | S-5 PDMS-ω-SiOH | 0.5 | 4.9 | 52 | 92 | 0.47 | B |
| Example 12 | S-6 PS-ω-Si(OMe)₃ | 0.6 | 4.3 | 53 | 90 | 0.46 | A |
| Tantalum nitride substrate | | TaN | Si oxide | TaN | Si oxide | | |
| Reference Example 5 (Control) | S-2 PS-ω-DOH | 3.6 | 3.6 | 37 89 | 46 88 | — | — A |
| Example 13 | S-5 PDMS-ω-SiOH | 0.5 | 4.8 | 39 | 91 | 0.46 | B |
| Example 14 | S-6 PS-ω-Si(OMe)₃ | 0.6 | 4.3 | 40 | 90 | 0.46 | A |
| Cobalt substrate | | Copper | Si oxide | Copper | Si oxide | | |
| Reference Example 6 (Control) | S-9 PMMA-ω-OHp | 3.5 | 3.5 | 10 68 | 36 68 | — | — A |
| Example 15 | S-10 PMMA-b-DMS-ω-SiOH | 0.5 | 4.3 | 69 | 38 | 0.45 | B |
| Example 16 | S-11 PMMA-ω-Si(OMe)₃ | 0.5 | 5.4 | 68 | 37 | 0.66 | A |
| Example 17 | S-12 PMMA-ω-SiH | 0.5 | 2.7 | 68 | 37 | 0.33 | A |

Evaluation of Selective Surface Modification of Striped Substrate of Copper-Silicon Oxide Examples 18 to 20 and 26 to 28, Comparative Example 3 and Reference Example 7

Figure 2:
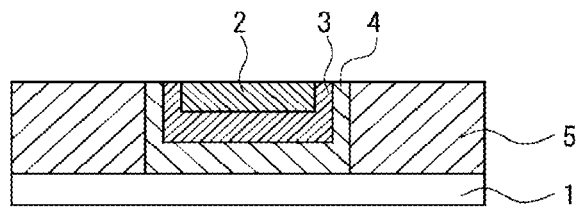
FIG. 2 is a cross sectional view illustrating a cross sectional view of a striped substrate used for evaluation of selective surface modification.

An eight-inch substrate shown in FIG. 1 (Cu-EPC (2): 10,000 Å/Cu-Seed (3): 1,000 Å/TaN Barrier Layer (4): 250 Å/silicon oxide (5): 5,000 Å/silicon wafer (1), 0.18 μm trench) was ground with a CMP slurry to produce a substrate including copper and silicon oxide arranged in a striped shape as shown in FIG. 2 below. Next, this substrate was immersed in a 5% by mass aqueous oxalic acid solution and thereafter dried with a nitrogen flow, whereby the oxidized coating film on the surface was removed.

The compositions prepared as described above were spin-coated on the substrate by using Track ("TELDSA ACTS" available from Tokyo Electron Limited) at 1,500 rpm, and baked at 150° C. for 180 sec. The substrate was subjected to a separation with PGMEA to remove unreacted polymer. Next, the surface was observed under a scanning probe microscope ("S-image" (microscope unit) and "Nano Navi Real" (control station) available from Hitachi High-Technologies Science Corporation), and the film thickness of the coating was calculated from the recess and protrusion.

Average thickness (nm) of the coating film of the polymer formed on each region containing silicon oxide or copper on the copper-silicon oxide striped substrate is each shown in Table 3. In Table 3, "ND" indicates that the thickness was so small that the detection failed.

TABLE

| | | | Copper-silicon oxide striped substrate | |
|---|---|---|---|---|
| | | | Thickness (nm) | |
| | Composition | Sample | Copper | Si oxide |
| Comparative Example 3 | S-1 | PS-ω-H | ND | ND |
| Reference Example 7 | S-3 | PS-ω-COOH | 4.5 | 4.6 |
| Example 18 | S-5 | PDMS-ω-SiOH | ND | 4.9 |
| Example 19 | S-6 | PS-ω-Si(OMe)₃ | ND | 5.1 |
| Example 20 | S-7 | PS-ω-SiH | ND | 2.5 |
| Example 26 | S-13 | PS-ω-Si₂Me₅ | ND | 4.8 |
| Example 27 | S-14 | PS-b-PSTMS | ND | 4.6 |
| Example 28 | S-15 | PS-b-DMAEMA | ND | 5.1 |

From the results shown in Tables 2 and 3, it was revealed that the method for selectively modifying a base material surface of Examples enabled easy, highly selective and dense modification of surface regions containing silicon.

The method for selectively modifying a base material surface and the composition for use in selective modification of a base material surface of the embodiments of the present invention enable easy, highly selective and dense modification of surface regions containing silicon. Therefore, the method for selectively modifying a base material surface and the composition can be each suitably used for working processes of semiconductor devices, and the like, in which microfabrication is expected to be further in progress hereafter.

Obviously, numerous modifications and variations of the present invention are possible in light of the above teachings. It is therefore to be understood that within the scope of the appended claims, the invention may be practiced otherwise than as specifically described herein.

The invention claimed is:

1. A selective modifier composition, comprising:
   a polymer comprising, at an end of a main chain or a side chain thereof, a group comprising a first functional group capable of forming a bond with silicon; and
   a solvent,
   wherein the first functional group is one of a silanol group, a methoxysilyl group, and a hydrosilyl group, and
   the main chain of the polymer consists of at least one structural unit selected from the group consisting of
   a structural unit derived from a substituted or unsubstituted styrene,
   a structural unit derived from a (meth)acrylic acid or a (meth)acrylic acid ester, and
   a structural unit containing a —Si—O— bond.

2. The selective modifier composition of claim 1, wherein the polymer has a polystyrene equivalent number average molecular weight of 500 50,000.

3. The selective modifier composition of claim 1, wherein the first functional group is a silanol group.

4. The selective modifier composition of claim 2, wherein the first functional group is a silanol group.

5. The selective modifier composition of claim 1, wherein the main chain of the polymer consists of a structural unit derived from a substituted or unsubstituted styrene.

6. The selective modifier composition of claim 4, wherein the main chain of the polymer consists of a structural unit derived from a substituted or unsubstituted styrene.

7. The selective modifier composition of claim 1, wherein the group comprising the first functional group is present at one end of the main chain of the polymer.

8. The selective modifier composition of claim 6, wherein the group comprising the first functional group is present at one end of the main chain of the polymer.

9. The selective modifier composition of claim 4, wherein the first functional group is a methoxysilyl group.

10. The selective modifier composition of claim 4, wherein the first functional group is a methoxysilyl group.

11. A method for selectively modifying a base material surface, the method comprising:
    applying the selective modifier composition of claim 1 on a surface of a base material such that a coating film is formed on the surface having a first region comprising silicon; and
    heating the coating film.

12. The method according to claim 11, wherein the first region comprises a silicon oxide, a silicon nitride, or a silicon oxynitride.

13. The method according to claim 11, wherein:
    the base material further comprises a second region that is other than the first region and that comprises a metal; and
    the method further comprises, after the heating, removing with a rinse agent a portion of the coating film, the portion being formed on the second region.

14. The method according to claim 11, wherein a polystyrene equivalent number average molecular weight of the polymer is no less than 500 and no greater than 50,000.

15. The method according to claim 11, wherein
    the first functional group is a silanol group or a methoxysilyl group.

16. The method according to claim 11, wherein the main chain of the polymer consists of a structural unit derived from a substituted or unsubstituted styrene.

17. The method according to claim 11, wherein the polymer comprises at one end of the main chain thereof, the group comprising the first functional group.

18. The method according to claim 13, further comprising bringing an alcohol, a dilute acid, a hydrogen peroxide solution, ozone or plasma into contact with the surface of the base material after the removing.

19. The method according to claim 13, further comprising depositing a pattern on the surface of the base material after the removing, with a CVD method or an ALD method.

20. The method according to claim 13, further comprising etching away the polymer from the surface of the base material after the removing of the portion of the coating film.

* * * * *